United States Patent [19]

Boucard et al.

[11] Patent Number: 4,931,908
[45] Date of Patent: Jun. 5, 1990

[54] HOUSING FOR AN ELECTRONIC CIRCUIT

[75] Inventors: Michel R. J. Boucard, Tournefeuille; Thirion C. Francois, Auterive, both of France

[73] Assignee: Siemens Aktiengesellschaft, Munich, Fed. Rep. of Germany

[21] Appl. No.: 325,631

[22] Filed: Mar. 20, 1989

[30] Foreign Application Priority Data

Mar. 30, 1988 [FR] France .................. 88 04199

[51] Int. Cl.$^5$ .............................................. H05K 1/14
[52] U.S. Cl. .................................... 361/395; 361/401; 361/406; 361/414
[58] Field of Search ............... 174/68.5; 361/395, 397, 361/399, 400, 401, 406 X, 408 X, 409, 412, 414 X

[56] References Cited

U.S. PATENT DOCUMENTS

| | | | |
|---|---|---|---|
| 3,013,188 | 12/1961 | Kohler | 361/406 |
| 3,079,577 | 2/1963 | Brownfield | 361/406 |
| 3,325,691 | 6/1967 | Dahlgren et al. | 361/406 |
| 3,386,009 | 5/1968 | Grabbe | 361/406 |
| 3,621,338 | 11/1971 | Rogers et al. | 361/406 |

FOREIGN PATENT DOCUMENTS 2603763 3/1988 France .
2136203 9/1984 United Kingdom .

OTHER PUBLICATIONS

Landis, "High-Speed Packaging For GaAs Interconnection", 3/85, pp. 384–388.

Primary Examiner—Gregory D. Thompson
Attorney, Agent, or Firm—Russel C. Wells; George L. Boller

[57] ABSTRACT

The housing comprises a bottom 1 in the thickness of which the extension of an input/output pin 5 of the housing is embedded. This extension ends in a contact terminal 15 which lies flush with the surface of a substrate 7 carrying passive or active electronic components 11, 12 and interconnecting conductor tracks 10, 10', 10''. A conductor track 10 passing over an opening 6 in the substrate which accommodates the terminal 15 is soldered onto this terminal in order to interconnect a terminal 14 of the component 12 with the input/output pin 5 of the housing. An interconnection via side terminals 13, 13', 13'', ..., which complicates the layout of the conductor tracks to be provided for this purpose, is thus no longer required.

6 Claims, 2 Drawing Sheets

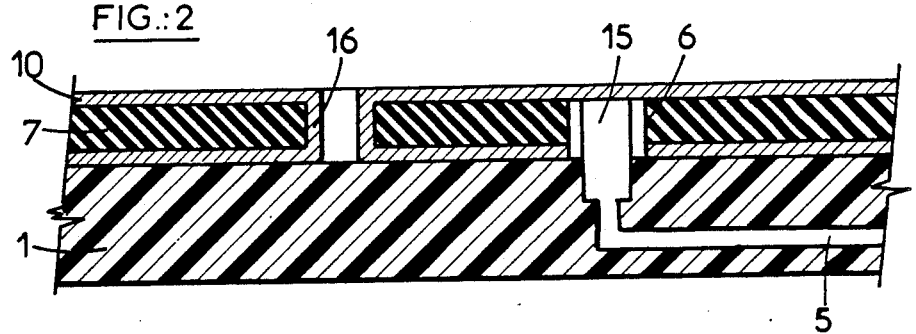
FIG.:2
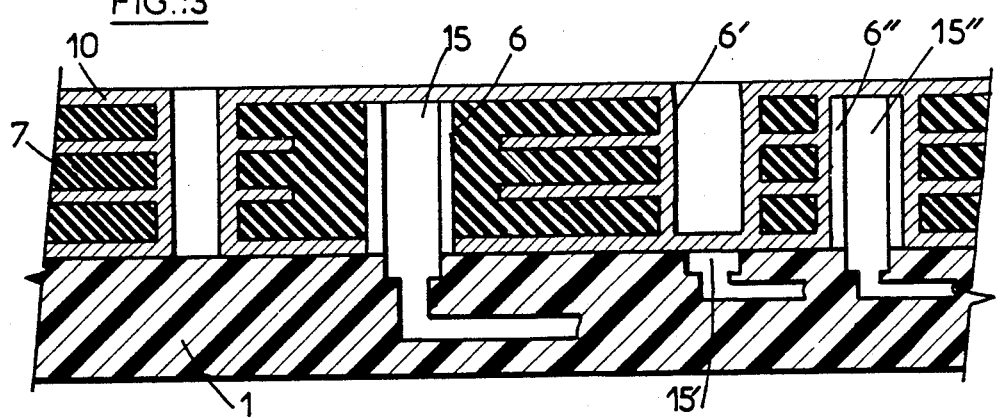
FIG.:3
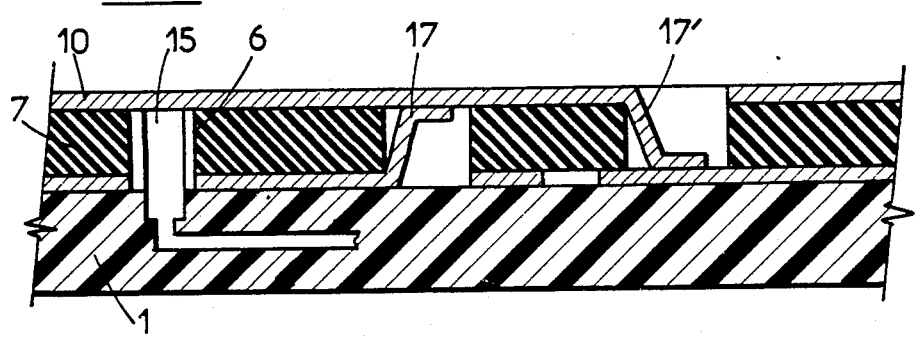
FIG.:4

4,931,908

HOUSING FOR AN ELECTRONIC CIRCUIT

FIELD OF INVENTION

The present invention relates to a housing for an electronic circuit and, more particularly, to such a housing designed to protect an electronic circuit with automatable connections.

An electronic circuit consisting of several active or passive components arranged on a substrate is commonly arranged inside a housing which protects it from external attack. It is therefore necessary to effect electrical connections between the circuit located inside the housing and an electrical and/or electronic environment outside this housing so that the various input or output signals necessary for the housing to operate in this environment can be transmitted. By way of an example of such a situation, mention may be made of the case where an electronic circuit housing, by processing suitable signals, operates various actuators on the basis of signals received from various sensors. Such a situation is frequently found in automotive-car electronics.

Conventionally, the necessary electrical connections are established by means of pins which pass through the wall of the housing and which are arranged in lines so as to be able to cooperate with a multipole connector suitable for connecting each pin to a source of a circuit input signal or to a component or apparatus using the signal processed by the circuit. Inside the housing, the connection between these pins and the circuit is effected by metal strips or wires, each soldered at one end onto a pin and, at the other end, onto a metal contact terminal forming part of a series of terminals arranged in line parallel to one of the edges of the substrate on which the electronic circuit is mounted. The presence of two soldering zones for each connection may thus be noted. Reducing the number of these soldering points in order to increase the reliability of the circuit and reduce its manufacturing cost has been contemplated. To achieve this, it has been proposed that the housing be equipped with a pin which is extended, inside the housing, by a flexible lug formed as one piece with the pin, the single free end of this lug being then soldered onto a contact terminal located close to one edge of the circuit substrate.

In addition to the cited drawbacks of the wire or metal strip connections with two soldered end zones, it will be noted that all the connection methods described above, which form part of the prior art, have the drawback that the connection terminals mounted on the substrate must be aligned in a zone close to at least one edge of the substrate, itself parallel to a series of pins passing through the housing, be it merely in order to reduce the length of the connecting strips or wires. Various conductor tracks, mounted on the substrate, connect the terminals of the substrate to the actual electronic circuit. It is obvious that these tracks must avoid each other, thereby complicating the layout of the tracks mounted on the substrate.

The object of the present invention is to provide a housing for an electronic circuit which is designed to simplify the electrical connections effected between this circuit and input/output pins of the housing and which does not require that these connections be established by means of specialized contact terminals arranged in the vicinity of at least one of the edges of a substrate on which the electronic circuit is mounted.

Another object of the present invention is to provide such a housing in which the electrical connections make use of conductor tracks normally arranged on the circuit substrate.

Yet another object of the present invention is to provide such a housing designed so as to impose no topographical constraints as regards the location of the electrical connections between the circuit and the input/output pins of the housing, such that there is therefore great flexibility with regard to installation of these connections.

A further object of the present invention is to provide a housing for an electronic circuit suitable for the electrical connections to be effected in an automated manner during the mass-production of such a housing.

These objects of the invention, as well as others which will become apparent in the remainder of the present description, are achieved with a housing for an electronic circuit comprising a bottom onto which is fixed a substrate made of insulating material, at least one surface of which carries active and/or passive components and electrical conductor tracks or bands connecting the components to one another and/or to electrical contact pins emerging outside the housing so as to ensure interconnection of the circuit contained inside the housing with at least one electrical and/or electronic apparatus associated with and located outside the housing, characterized in that at least one of the pins extends inside the thickness of the housing wall so as to pass through the surface of the bottom of the latter which supports the substrate and pass into an opening formed in the latter so as to present one end flush with the surface of the substrate carrying the conductor tracks or bands, at least one of these tracks or bands passing above this opening in such a way as to be in electrical contact with this end of the pin.

Thus, as a result of the housing according to the invention, it is no longer necessary to form, on the substrate, conductor tracks which could hinder the connection of a particular track to an input or output pin, by means of a connection terminal formed in the proximity of one edge of the substrate. It is therefore possible to free this substrate from the tracks conventionally used to connect the circuit to the pins.

The housing according to the invention also results in a greater flexibility in the choice of connection points between the pins and the circuit since the said pins may be located on any point of the substrate, thereby helping optimize the layout of the circuit mounted on the substrate owing to the additional freedom which is thus offered to the circuit designer.

DESCRIPTION OF THE DRAWINGS

In the accompanying drawings:

FIG. 2 is a sectional view of a part of a housing according to a second embodiment of the invention, FIG. 3 is a sectional view of a part of a housing according to a third embodiment of the invention, and FIG. 4 is a sectional view of a part of a housing according to a fourth embodiment of the invention.

DETAILED DESCRIPTION

Figure 1:
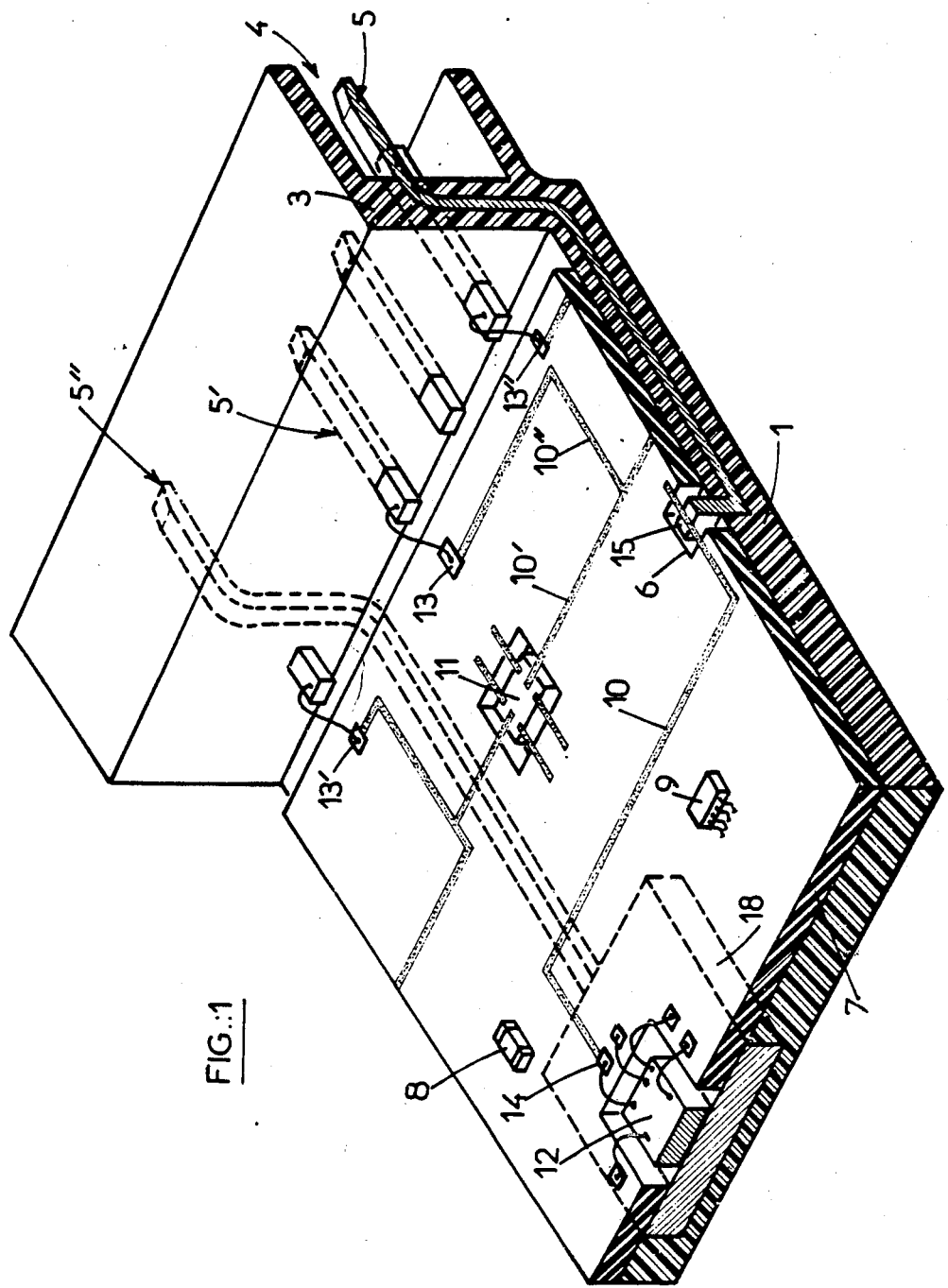
FIG. 1 is a partial perspective and sectional view of a housing for an electronic circuit according to the present invention.

Reference is made first of all to FIG. 1 which shows a part of the bottom 1 of the housing according to the invention, defined by two mutually perpendicular cutting planes. The same numerical reference, indexed where necessary, indicates in the Figures elements or members which are identical or similar.

The housing is closed hermetically by a cover (not shown) fixed onto an upper opening of the bottom. From a side wall 3 of the bottom 1 there emerges a seating 4 designed to protect groups of electrical connection pins 5, 5', etc. arranged for example in two parallel lines. This seating is dimensioned so as to receive in complementary fashion a connector (not shown) which establishes a connection between an electronic circuit contained inside the housing and external members or apparatus which exchange electrical signals with the circuit which the housing has the function of protecting from possible deterioration resulting from external factors (humidity, temperature, dust, etc.). Holes are formed in an extension (not shown) of the bottom of the housing. These holes are intended to have fixing members such as screws passing through them, for fixing the housing on a support in the position for use. All these arrangements are commonly used and will not be described further.

Conventionally still, a substrate 7 suitable for receiving components of the electrical circuit is fixed onto the bottom of the housing. This bottom may be made of an organic or inorganic material and have a multilayered structure with conduction layers as will be seen below, and conductor tracks such as 10, 10', 10" (see FIG. 1), as is well known. The substrate may consist of a polyimide, epoxy resin or ceramic sheet, for example, possessing thicknesses of between 0.1 and 1 mm, this sheet having conductor tracks.

Passive or active components of all types are mounted on the substrate according to the particular organization of the circuit, these components being intended to make the latter perform certain functions. The passive components may be resistors, capacitors or self-induction coils which are conventional or of the surface-mounted type for example. The active components may consist of discrete or integrated components in the form of a chip which is exposed or inside a casing of various known types. By way of example, FIG. 1 shows, on the circuit substrate contained inside the housing, a surface-mounted resistor 8 and an encased integrated circuit 9 for surface mounting. The circuit may also comprise other components 11, 12. By way of example, the component 11 may be an integrated circuit having several output terminals. In FIG. 1 it can be seen that the conductor tracks 10', 10" connect one of these output terminals to a pin 5' of the housing according to the invention, so as to allow the integrated circuit 11 to exchange signals with electrical or electronic apparatus outside the housing, via the pin 5'. In FIG. 1 it can be seen that, owing to the proximity of the integrated circuit 11 in relation to the edge of the substrate which is parallel to the wall 3 of the housing which carries the input/output pins, it is possible to connect in a simple manner the circuit 11 to the pin 5' by means of conductor tracks running along the upper surface of the substrate 7. Conventionally, this connection is completed by a conduction wire soldered at its ends, on the one hand, to the pin 5' and, on the other hand, to a contact terminal 13. In the drawing it can be seen that this contact terminal 13 forms part of a set of terminals 13, 13', 13", etc. formed parallel to the edge of the substrate which is located opposite the wall 3 of the housing which carries the pins, as is conventional.

Reference is now made to the component 12 shown in FIG. 1 as occupying, in relation to the set of terminals 13, 13', 13", a position further removed than that occupied by the integrated circuit 11. The component 12 is itself, for example, an exposed integrated circuit comprising several output terminals, one of which is conventionally connected by a wire soldered to a contact terminal 14 formed on the substrate. Owing to the intermediate positions occupied by the conductor tracks 10' and 10" on the substrate, it will be easily understood from an examination of FIG. 1 that it is difficult, or even impossible, to connect the terminal 14 to the pin 5 for example, by means of a conductor track running along the substrate 7. In order to overcome this difficulty, the conventional solution consists in complicating the configuration of the tracks 10' and 10" so as to clear a path towards a contact terminal of the series 13, 13', 13" etc., for a conductor track which starts from the terminal 14. Such complications hinder the design of the conductor tracks to be formed on the substrate 7.

According to the present invention, this difficulty is eliminated by suitably extending the pin 5 inside the thickness of the wall of the housing in such a way that one end of this pin is able to lie flush, through an opening formed in the substrate, with the surface of this substrate which carries the conductor tracks, in a position where the connection of this pin to the terminal 14, for example, may be effected simply by a conductor track 10 running inside a space formed on the substrate surface as far as the contact terminal 14. To achieve this, the pin 5 is profiled so as to correspond the substrate. Such arrangements where tracks pass over the openings may be obtained by the conventional "subtractive" method used to form printed circuits. According to this method, firstly the openings for the terminals to pass through are formed in the substrate, the substrate is then laminated with a layer of copper, with or without glue. In order to apply the invention, a copper sheet with a thickness of 35 or 70 micrometres will preferably be used. The copper sheet is then covered with a dry photosensitive film, on the substrate side, the other side of the copper sheet is doubled by lamination with a reinforcing film which covers at least the entire surface of the opening. After exposure of the photosensitive film to the track configuration required for the substrate and removal of this film, a track portion is obtained, passing above the opening from one edge to the other of the latter. Other known methods could be used for this purpose. By way of example, mention may be made of the interconnection method known as TAB (from the English expression "Tape Automated Bonding") in its version called "dual layer TAB".

Of course, the openings in the pin/circuit connection zones of the substrate could be entirely closed by a conduction band and not merely partially covered by a conductor track such as those referred to above.

The housing according to the invention could preferably be made using the injection-moulding method. More precisely, the pins such as the pin 5 are therefore fixed against the bottom of a mould by means of holding studs, in predetermined positions corresponding to those assigned to the terminal 15 on the bottom of the housing to be obtained, and the method of double moulding is then used in order to fix the pins in position and then fill the locations occupied by the holding studs, after withdrawal of the latter.

Various thermoplastic or thermosetting materials may be used for the injection operations, as chosen by the person skilled in the art. It is possible, for to the shape of the walls of the housing inside which it must pass in order to reach an opening 6 in the substrate. In the region of this opening 6, the pin 5 is folded again in such a way that its end assumes the shape of a terminal 15 lying flush with the surface of the substrate 7. This terminal 15 could also be mounted by means of riveting or soldering. According to the invention, the track 10 passes above the opening 6 in such a way as to come into contact with the terminal 15. The electrical contact between the terminal 15 and the track 10 is effected by a suitable solder joint obtained using conventional methods, electrical soldering, metal remelting, thermocompression, etc. Of course, the conductor track 10 and the terminal 15 of the pin 5 are made of materials which enable the chosen soldering method to be used.

It will be understood that, owing to the particular configuration of the pin 5 incorporated in the housing according to the invention, it is possible to have a connection terminal such as 15 emerging over most of the surface of the substrate, which means that one is not limited, as regards the connections with the pins of the housing, to the terminals 13, 13', 13'' etc. aligned along one edge of the substrate. Thus, the geometrical projection of the pin on the surface of the substrate which supports conductor tracks may intersect at least one of these conductor tracks. The distribution of the contact terminals 15 and openings 6 associated with these terminals, over the surface of the substrate may therefore be balanced and allow the occupation of areas of this substrate which otherwise would remain unoccupied. It is therefore possible to free the surface of the substrate from conductor tracks such as 10', 10'' which serve solely to establish, on one edge of the substrate, connections between terminals or pins of electronic components and input/output pins of the housing.

The substrate located inside the housing according to the invention must comprise portions of conductor tracks which pass above openings such as the opening 6 in example, to choose the products sold under the names RYTON, VALOX 420, RINITE 530, which are marketed by the companies called PHILLIPS PETROLEUM, GENERAL ELECTRIC and DU PONT DE NEMOURS, respectively.

Reference is now made to FIGS. 2 to 4 of the drawing in order to describe different particular substrate configurations suitable for implementing the present invention. These figures show cross-sections of these substrates, passing through a contact terminal 15 along the axis of a conductor track soldered to this terminal. In these figures, identical or indexed reference numbers correspond to identical or similar elements or members.

In FIG. 2, the substrate made of insulating material 7 is metallized on its two surfaces in accordance with conductor track or band configurations, the metallized coats being interconnected by metallized holes such as the hole 16 passing through the substrate. In this embodiment, the terminal 15 of the pin 5 is soldered to a conductor track formed on the upper surface of the substrate (from the point of view of the figure). At right angles to the opening 6, the lower surface of the substrate is free from any metallization. Of course, an electrical contact could also be established in the region of the lower metallized surface of the substrate.

FIG. 3 shows a multilayered substrate comprising several conduction layers distributed inside the thickness of the substrate 7, the two external surfaces of the substrate 7 themselves being metallized in accordance with conductor track or band configurations. With this type of substrate, the electrical contact between a terminal 15 and a conductor track may be established in an opening 6 for example, in the region of the upper surface of the substrate, or, on the other hand, in the region of the lower surface of this substrate, by means of a terminal 15' embedded in the bottom 1 of the housing and lying flush with the surface of this bottom, making electrical contact with a conduction band or track formed on the substrate surface which is located opposite this bottom. The opening 6' thus assumes the form of an entirely metallized hole. Alternatively, the contact between a terminal 15'' and a conductor track running over the upper surface of the substrate 7 may be established inside an entirely metallized opening 6'' using the substrate surface which is located opposite the bottom of the housing.

In FIG. 4, the substrate shown assumes the form of that used in the abovementioned interconnection method called "dual layer TAB". According to this interconnection method, the conduction layers or tracks formed on the two surfaces of the substrate 7 are interconnected by lugs 17, 17' passing through the substrate inside openings formed for this purpose in the substrate. Such a type of substrate is perfectly suited for incorporation of the contact terminals 15 of the pins 5 according to the invention, passing inside openings 6 in the said substrate.

Reference is made again to FIG. 1 which shows in broken lines a pin 5'' which is also extended inside the thickness of the walls of the bottom of the housing according to the invention by a dissipator 18, one surface of which lies flush with the bottom of the housing. In the example of embodiment shown in FIG. 1, the component 12 is a power component having an extended electrode soldered onto the dissipator 18 which dissipates calories produced in the region of this electrode by the passage of a strong current, so as to avoid any heating of the circuit. For this purpose, the power component 12 is itself located inside a suitable opening in the substrate. A housing comprising such a dissipator is described more completely in French Patent Application No. 87 12241 filed on 3 September 1987 by the Applicant. It will be noted that the pins 5 with interconnection terminals 15 of the housing according to the invention may be associated with a pin 5'' with a dissipator 18 embedded in the bottom of the housing by means of common duplicate moulding in the material forming the housing. It is thus possible to associate interconnection functions on the one hand and cooling functions on the other hand inside a single housing incorporating pins embedded in the material of the housing.

Of course, the invention is not limited to the embodiments described and shown which have been given only by way of example. In particular varied configurations of pins could be adopted in particular in the portion of these pins which pass inside the bottom 1 of the housing. Suitable overlapping of the locations assumed by the various pins in this bottom must therefore be ensured.

Similarly a connection terminal such as 15 may be defined in a location such as that occupied by the connection terminal 14 of the conductor track 10, so as to ensure a direction connection between the terminal 15 the corresponding terminal of the component 12, by means of a conventional soldered wire, for example.

The housing according to the invention enables the surface offered for the interconnections between the circuit mounted on the substrate and the input/output pins of the housing to be doubled. The conventional interconnection plane consisting of a surface of the substrate is in fact doubled by the plane situated inside the thickness of the housing, where the extensions of the pins pass towards the interconnection terminals 15.

This double arrangement avoids the problems of forming other tracks on the surface of the substrate, when connection terminals formed close to one edge of the substrate are to be joined together in a conventional manner. There is also a reduction in the length of the interconnecting conductor tracks and freeing of the substrate surface. Furthermore, owing to the housing according to the invention, it is possible to interconnect in a simple manner any point of the circuit mounted on the substrate and an input/output pin of the housing. It is obvious also that the housing according to the invention is suitable for mass-production operations, such as those found in motor-car electronics for example, owing to the "automatable" nature of formation of the necessary electrical connections between the input/output pins of the housing and the circuit contained in this housing, by means of mechanized soldering operations.

We claim:

1. Housing for an electronic circuit, comprising a bottom onto which is fixed a substrate made of insulating material, at least one surface of which carries active and/or passive components and electrical conductor tracks or bands connecting the components to one another, and/or electrical contact pins emerging outside the housing so as to ensure interconnection of the circuit contained inside the housing with at least one electrical and/or electronic apparatus associated with and located outside the housing, characterized in that at least one (5) of the pins extends inside the thickness of the wall of the bottom (1) of the housing so as to pass through the surface of the bottom of the housing which supports the substrate and pass into an opening (6) formed in the substrate so as to present one end in the form of a contact terminal (15) which lies flush with the surface of the substrate carrying the conductor tracks or bands, at least one (10) of these tracks or bands passing above this opening in such a way as to be in electrical contact with this contact terminal of the pin.

2. Housing according to claim 1, characterized in that it comprises several pins, the ends of which outside the housing are aligned while the contact terminals of these pins which lie flush with the substrate surface carrying conductor tracks are dispersed over this surface.

3. Housing according to claim 1, characterized in that the substrate made of insulating material is metallized on its two surfaces in accordance with conductor track or band configurations, the contact terminal lying flush with a pin passing through both the metallized surface of the substrate which is in contact with the bottom of the housing and the thickness of the substrate, in order to come into electrical contact with at least one track or band on the other surface of the substrate.

4. Housing according to claim 1, characterized in that the substrate comprises several metal layers separated from each other in its thickness, the contact terminal of a pin coming into electrical contact with one of the external layers and the electrical connection between these layers being effected via metallized holes formed in these layers and in the substrate.

5. Housing according to claim 1, characterized in that the substrate is covered on its two surfaces by metal layers interconnected by lugs according to the interconnection method called "dual layer TAB".

6. Housing according to claim 1, characterized in that the conductor track or band is soldered onto the contact terminal of the pin.

* * * * *